(12) United States Patent
Kuo

(10) Patent No.: US 11,603,979 B1
(45) Date of Patent: Mar. 14, 2023

(54) LIGHT SOURCE MODULE

(71) Applicant: Ming-Teng Kuo, Tainan (TW)

(72) Inventor: Ming-Teng Kuo, Tainan (TW)

( * ) Notice: Subject to any disclaimer, the term of this patent is extended or adjusted under 35 U.S.C. 154(b) by 0 days.

(21) Appl. No.: 17/736,937

(22) Filed: May 4, 2022

(30) Foreign Application Priority Data

Oct. 3, 2021 (TW) .................................. 110136800

(51) Int. Cl.
 *F21S 45/47* (2018.01)
 *F21S 41/141* (2018.01)
 *F21S 45/48* (2018.01)

(52) U.S. Cl.
 CPC .............. *F21S 45/47* (2018.01); *F21S 41/141* (2018.01)

(58) Field of Classification Search
 CPC ..... F21S 41/141; F21S 45/47; F21Y 2115/10; H01L 2924/12041; H01L 33/62; H01L 33/647; H01L 2224/48247; H01L 2224/73265; H05K 2201/10106; H05K 1/0204; H05K 1/0206; H05K 2201/09854; H05K 2201/10416; H05K 2201/10969; F21V 29/70
 See application file for complete search history.

(56) References Cited

U.S. PATENT DOCUMENTS

| | | | | |
|---|---|---|---|---|
| 2010/0109052 | A1* | 5/2010 | Nakajima | ....... H01L 21/823475<br>257/E27.06 |
| 2013/0088870 | A1* | 4/2013 | Hsu | ...................... H05K 1/0206<br>362/249.01 |
| 2018/0062059 | A1* | 3/2018 | Kichima | ................. F21S 45/47 |

FOREIGN PATENT DOCUMENTS

TW 201338220 A 9/2013

* cited by examiner

*Primary Examiner* — Omar Rojas Cadima
(74) *Attorney, Agent, or Firm* — Muncy, Geissler, Olds & Lowe, P.C.

(57) ABSTRACT

A light source module including a ceramic substrate, copper traces, light emitting units, and heat conductive columns is provided. The first heat conductive column and the second heat conductive column correspond to the first light emitting unit and the second light emitting unit respectively. The negative electrode of the first light emitting unit is connected to the first copper trace, the positive electrode of the second light emitting unit is connected to the second copper trace, and the positive electrode of the first light emitting unit and the negative electrode of the second light emitting unit are connected to the third copper trace. An end of the first heat conductive column is connected to the positive electrode of the first light emitting unit, and an end of the second heat conductive column is connected to the negative electrode of the second light emitting unit.

8 Claims, 8 Drawing Sheets

LIGHT SOURCE MODULE

CROSS REFERENCE TO RELATED APPLICATION

This application claims the benefit of Taiwan Application Serial No. 110136800 filed on Oct. 3, 2021, which is incorporated herein by reference.

BACKGROUND OF THE INVENTION

1. Field of the Invention

The present invention relates to a light source module. Specifically, the light source module of the present invention has the heat conductive column penetrating through the copper trace and the ceramic substrate.

2. Description of Related Art

Light emitting diodes (LEDs) have the advantages of power saving, high luminous efficiency, long service life, and quick response, and are becoming more and more popular in various light source modules. In terms of automotive lighting, with the development of electric vehicles in recent years, how to improve the power consumption efficiency or reduce the power loss of all electrical equipment (especially automotive lighting fixtures) is an important issue for the development of electric vehicles.

As shown in FIG. 1A and FIG. 1B, in order to have a better light intensity for the light source module used in automotive lighting fixtures, the dies of the light emitting unit 16 (e.g., the light emitting diode (LED)) are tightly arranged. However, the temperature of the light emitting unit will rise sharply in use. If the light emitting units are not able to effectively dissipate heat will result in serious heat accumulation in the light source zone between the light emitting units. In the end, the light emitting unit has serious light attenuation, which greatly reduces the luminous efficiency of the light emitting unit and even damaged the light emitting unit. The heat accumulation and light attenuation will worsen if the number of the light emitting units 16 is more.

In addition, as shown in FIG. 1C, under the traditional thermoelectric separation structure, the heat conduction path of the light emitting unit 16 is simply conducted through the ceramic substrate 12 to the metal substrate 11, so the light emitting unit 16 will have relatively high thermal resistance.

Accordingly, how to provide a light source module with good thermal conductivity and low thermal resistance is a technical problem that needs to be solved urgently.

SUMMARY OF THE INVENTION

An objective of the present invention is to provide a light source module, which is provided with a heat conductive column at a position under the light emitting units, and makes the heat conductive column penetrate through the ceramic substrate to the metal substrate. Two ends of the heat conductive column are respectively in contact with the light emitting unit and the metal substrate. Therefore, the heat generated by the light emitting unit can be conducted downward more quickly, so as to reduce the serious heat accumulation effect in the light source area between the light emitting units, reduce the light attenuation of the light emitting units, and improve the service life and the optical performance of the light emitting unit.

To achieve the aforesaid objective, the present invention discloses a light source module which includes a ceramic substrate, a first copper trace, a second copper trace, at least one third copper trace, a first light emitting unit, a second light emitting unit, a first heat conductive column, and a second heat conductive column. The first copper trace is disposed on the ceramic substrate. The second copper trace is disposed on the ceramic substrate. The at least one third copper trace is disposed on the ceramic substrate. The first light emitting unit is disposed on the ceramic substrate and has a positive electrode and a negative electrode. The second light emitting unit is disposed on the ceramic substrate and electrically connected to the first light emitting unit and has a positive electrode and a negative electrode. The first heat conductive column is disposed corresponding to the first light emitting unit and penetrates the at least one third copper trace and the ceramic substrate. The second heat conductive column is disposed corresponding to the second light emitting unit and penetrates the at least one third copper trace and the ceramic substrate. The negative electrode of the first light emitting unit is connected to the first copper trace, the positive electrode of the second light emitting unit is connected to the second copper trace, and the positive electrode of the first light emitting unit and the negative electrode of the second light emitting unit are connected to the at least one third copper trace. An end of the first heat conductive column is connected to the positive electrode of the first light emitting unit, and an end of the second heat conductive column is connected to the negative electrode of the second light emitting unit.

In one embodiment, the light source module further includes a metal substrate having a main plate, an insulating layer, and a layout layer. The main plate has a flat part and a protruded part, the insulating layer and the layout layer are disposed on the flat part, and the ceramic substrate is partially disposed on the protruded part.

Another end of the first heat conductive column and another end of the second heat conductive column are connected to the protruded part of the main plate of the metal substrate.

The first heat conductive column and the second heat conductive column are made of high heat conductivity material.

The first light emitting unit and the second light emitting unit are disposed in parallel along a first direction. The positive electrode and the negative electrode of each the first light emitting unit and the second light emitting unit are opposite to each other in a second direction.

The positive electrode of the first light emitting unit is adjacent to the negative electrode of the second light emitting unit.

The first light emitting unit and the second light emitting unit are disposed in parallel along a first direction, and the positive electrode and the negative electrode of each the first light emitting unit and the second light emitting unit are opposite to each other in a second direction, which is perpendicular to the first direction.

The positive electrode and the negative electrode of the first light emitting unit are respectively adjacent to the negative electrode and the positive electrode of the second light emitting unit.

The detailed technology and preferred embodiments implemented for the present invention are described in the following paragraphs accompanying the appended drawings for people skilled in this field to well appreciate the features of the claimed invention.

DETAILED DESCRIPTION OF THE PREFERRED EMBODIMENT

Figure 1A:
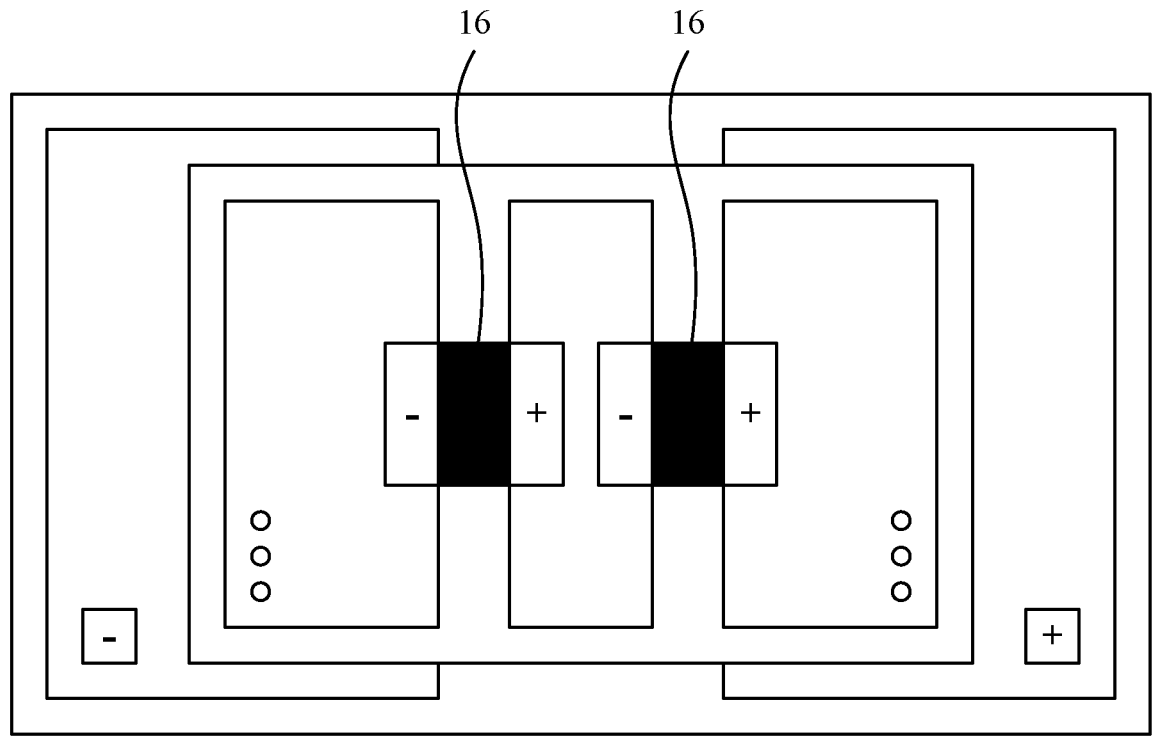
FIG. 1A is a schematic view of the layout of the conventional light source module.
Figure 1B:
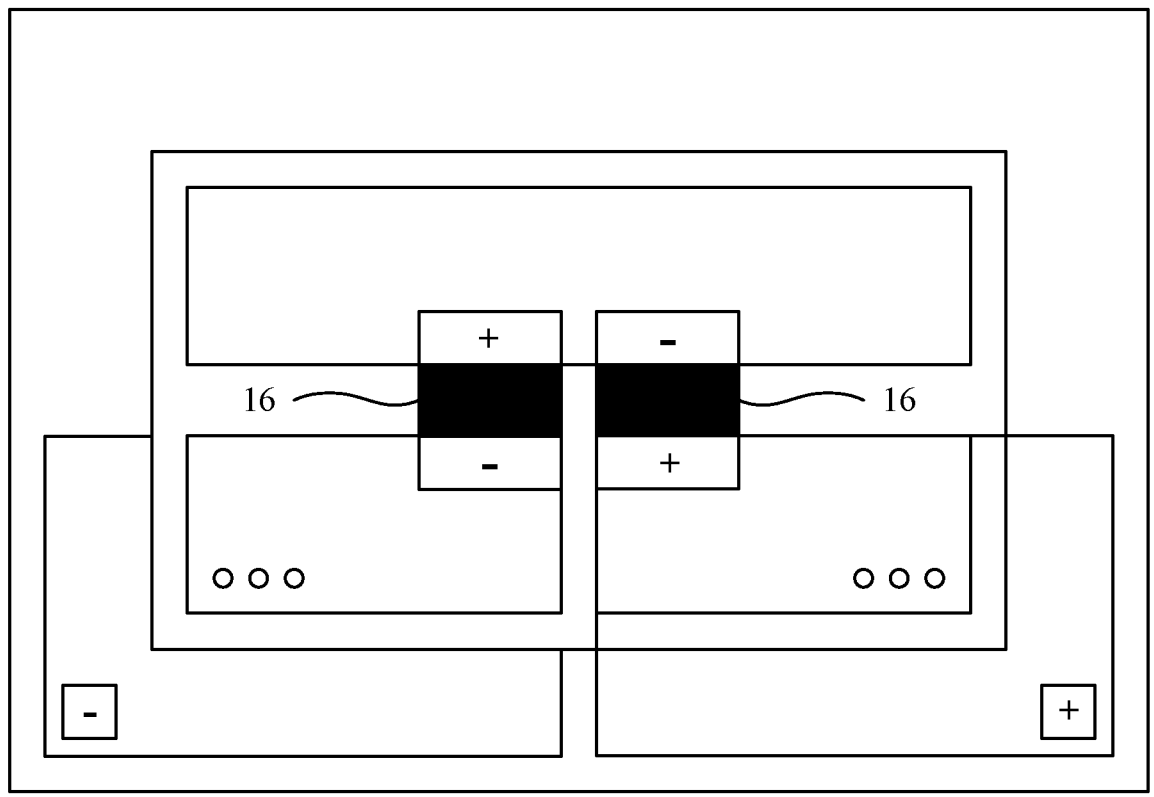
FIG. 1B is a schematic view of the layout of the conventional light source module.
Figure 1C:
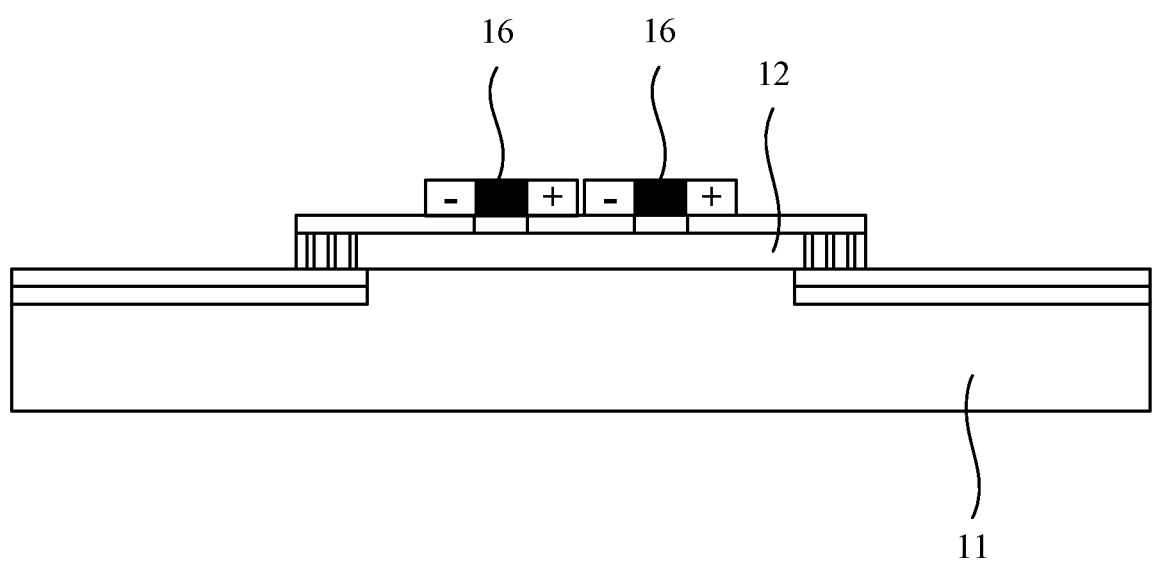
FIG. 1C is a cross sectional view of the conventional light source module.

Reference will now be made in detail to the present embodiments of the invention, examples of which are illustrated in the accompanying drawings, and are not intended to limit the present invention, applications or particular implementations described in these embodiments. Wherever possible, the same reference numbers are used in the drawings and the description to refer to the same or like parts. It shall be appreciated that, in the following embodiments and the attached drawings, elements unrelated to the present invention are omitted from depiction; and dimensional relationships among individual elements in the attached drawings are provided only for ease of understanding, but not to limit the actual scale.

Figure 2:
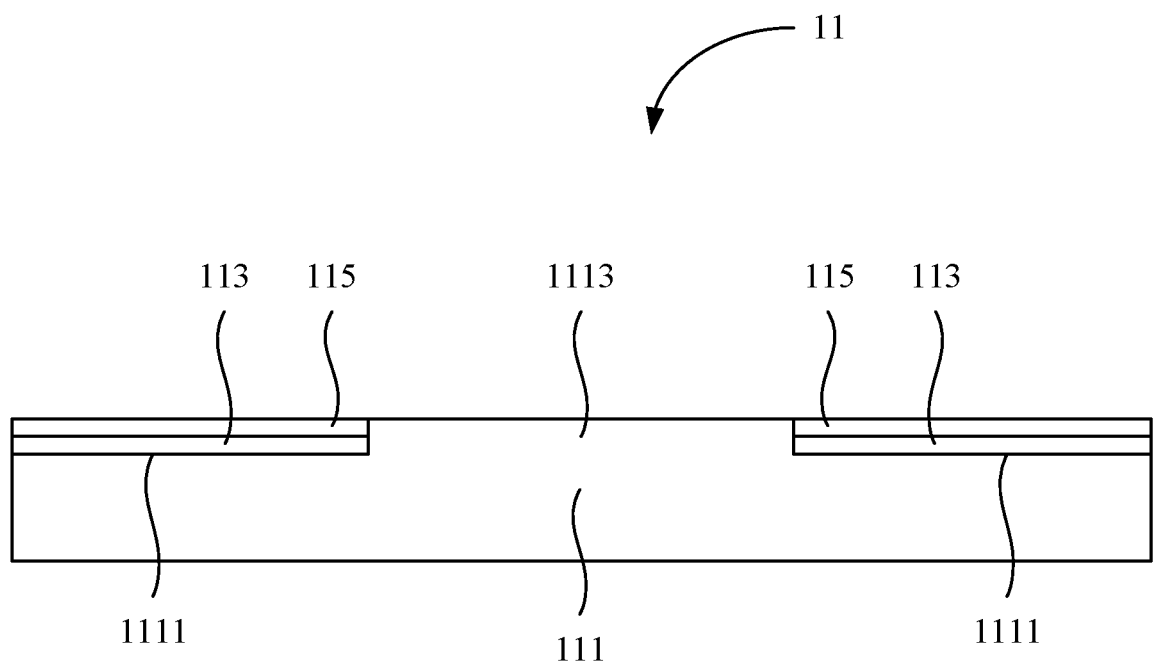
FIG. 2 is a cross sectional view of metal substrate of the light source module according to the present invention.

Reference is made to FIG. 2 to FIG. 6. The light source module 1 includes a metal substrate 11, a ceramic substrate 12, a first copper trace 13, a second copper trace 14, at least one third copper trace 15, a first light emitting unit 161, a second light emitting unit 163, a first heat conductive column 17, and a second heat conductive column 18. FIG. 2 is a cross sectional view of the metal substrate of the light source module according to the present invention. The metal substrate 11 has a main plate 111, an insulating layer 113, and a layout layer 115. The main plate 111 has a flat part 1111 and a protruded part 1113. The insulating layer 113 and the layout layer 115 are disposed on the flat part 111.

Figure 3:
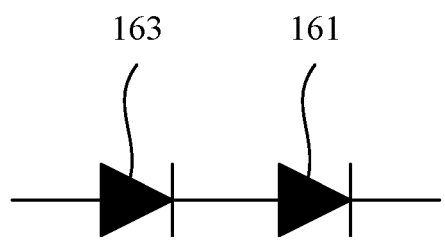
FIG. 3 is a schematic view of the circuit of the light emitting unit according to the present invention.

The ceramic substrate 12 is partially disposed on the protruded part 1113 of the metal substrate 11, and the ceramic substrate 12 may also be replaced with other types of insulating substrates. The first copper trace 13, the second copper trace 14, the third copper trace 15, the first light emitting unit 161, and the second light emitting unit 163 are all disposed on the ceramic substrate 12. The first light emitting unit 161 and the second light emitting unit 163 may be light emitting diode (LED) modules, but not limited thereto. The second light emitting unit 163 is electrically connected to the first light emitting unit 161, and the schematic view of the circuit is shown in FIG. 3.

Figure 4:
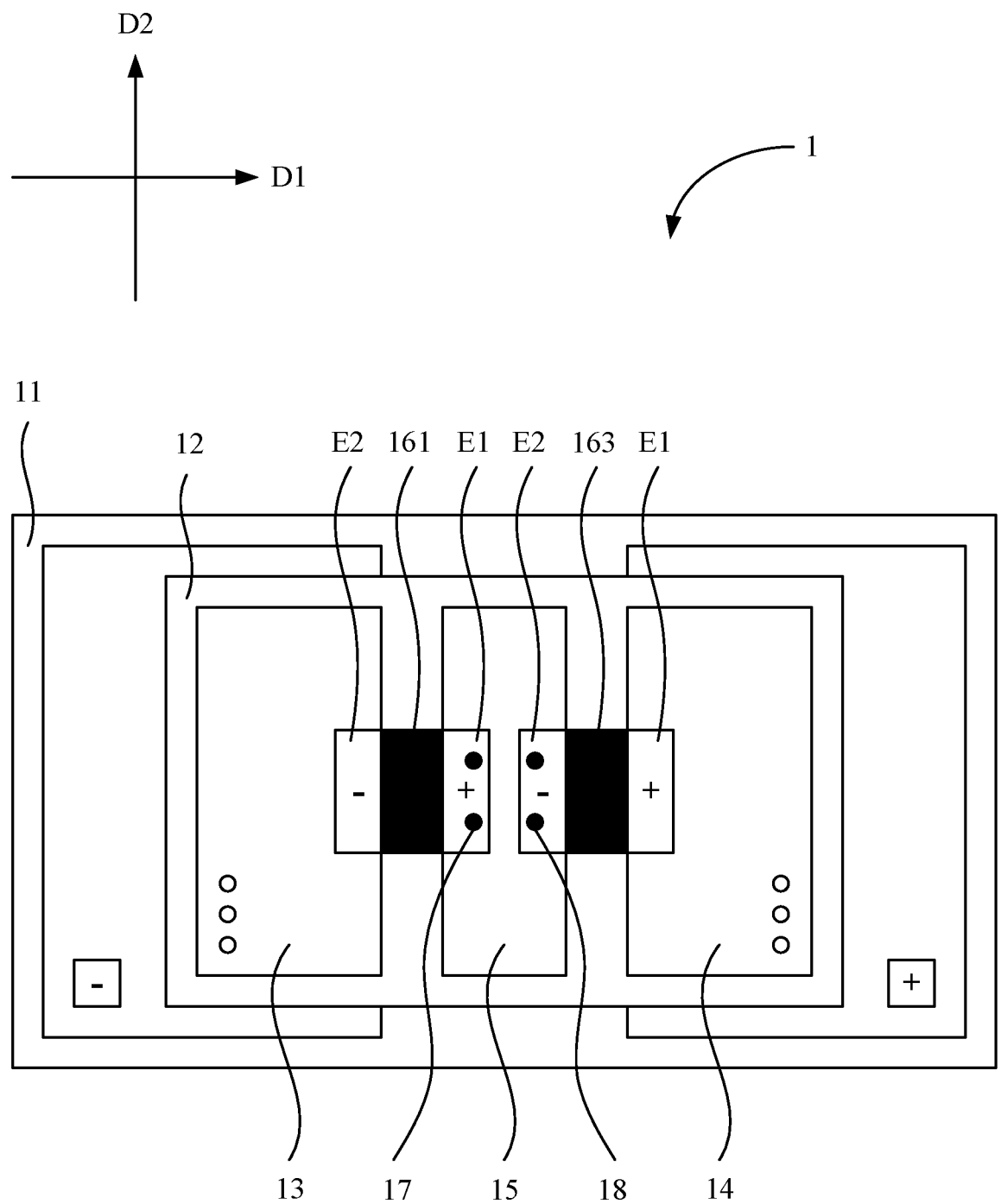
FIG. 4 is a schematic view of the layout of the light source module according to the present invention.
Figure 5:
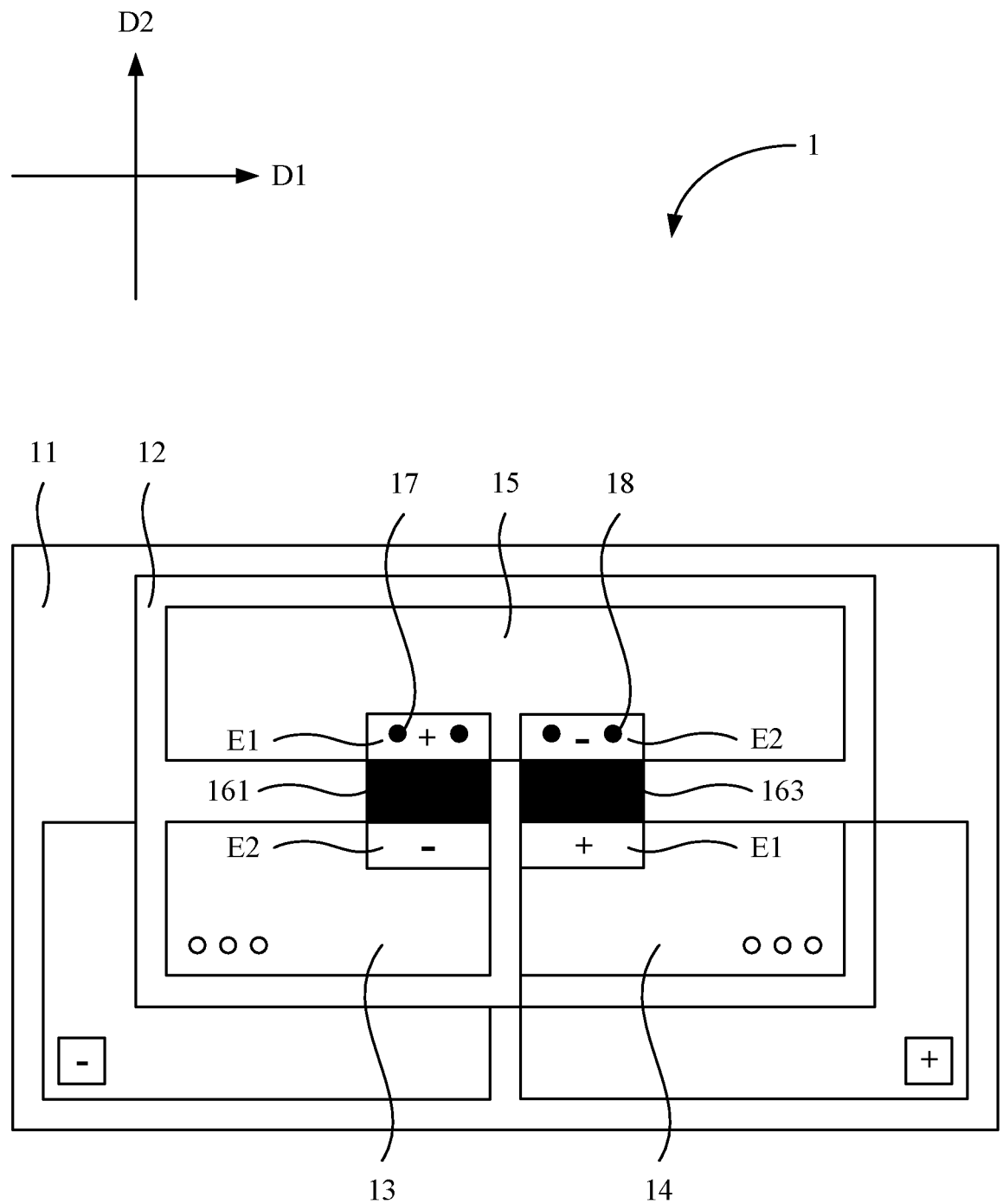
FIG. 5 is a schematic view of the layout of the light source module according to the present invention.
Figure 6:
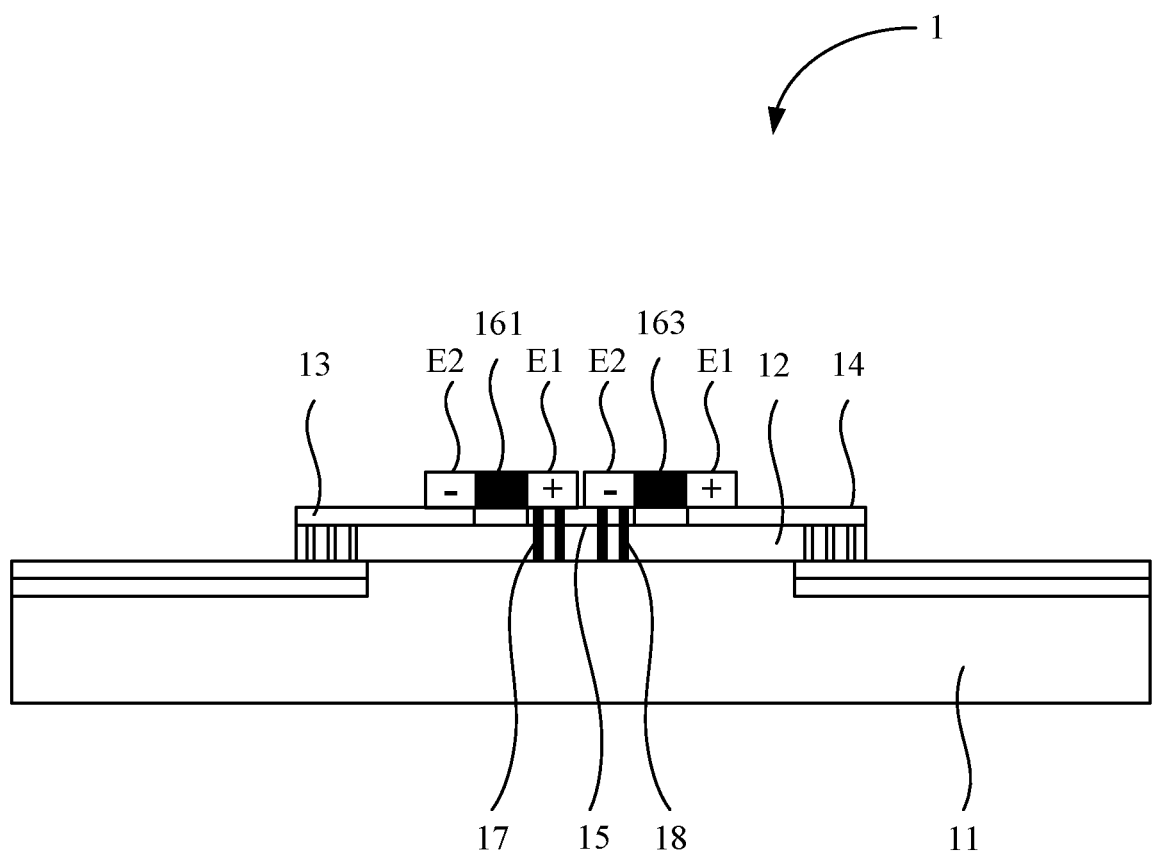
FIG. 6 is a cross sectional view of the light source module according to the present invention.

Reference is made to FIG. 4 to FIG. 6. FIG. 4 and FIG. 5 are different layout of the light source module of the present invention. FIG. 6 is a cross sectional view of the light source module 1 shown in FIG. 4 and FIG. 5. In FIG. 4, the first light emitting unit 161 and the second light emitting unit 163 are disposed in parallel along a first direction D1. Both of the first light emitting unit 161 and the second light emitting unit 163 have a positive electrode E1 and a negative electrode E2, the positive electrode E1 and the negative electrode E2 are opposite to each other in a first direction D1. In other words, the first light emitting unit 161 and the second light emitting unit 163 in FIG. 4 are arranged in the same direction.

The negative electrode E2 of the first light emitting unit 161 is connected to the first copper trace 13, and the positive electrode E1 of the second light emitting unit 163 is connected to the second copper trace 14. Therefore, the first copper trace 13 is the negative electrode of the light source module 1, and the second copper trace 14 is the positive electrode of the light source module 1. Other coupling points, which are not connected to the first copper trace 13 and the second copper trace 14, among the light emitting unit are all connected to the third copper trace 15. It means that the positive electrode E1 of the first light emitting unit 161 and the negative electrode E2 of the second light emitting unit 163 are connected to the third copper trace 15, and the positive electrode E1 of the first light emitting unit 161 is adjacent to the negative electrode E2 of the second light emitting unit 163.

The first heat conductive column 17 corresponds to the first light emitting unit 161 and penetrates through the third copper trace 15 and the ceramic substrate 12. In fact, the first heat conductive column 17 is located directly under the positive electrode E1 of the first light emitting unit 161. One end of the first heat conductive column 17 is connected to the positive electrode E1 of the first light emitting unit 161, and the other end is connected to the protruded part 1113 of the main plate 111 of the metal substrate 11. The second heat conductive column 18 corresponds to the second light emitting unit 163 and penetrates through the third copper trace 15 and the ceramic substrate 12. In fact, the second heat conductive column 18 is located directly under the negative electrode E2 of the second light emitting unit 163. One end of the second heat conductive column 18 is connected to the negative electrode E2 of the second light emitting unit 163, and the other end is connected to the protruded part 1113 of the main plate 111 of the metal substrate 11.

The first heat conductive column 17 and the second heat conductive column 18 are made of high thermal conductivity material, for instance, copper, aluminum, silver or other metal materials with high thermal conductivity or graphene, to quickly dissipate the heat generated by the first light emitting unit 161 and the second light emitting unit 163, so the first light emitting unit 161 and the second light emitting unit 163 will not be over-heating.

It shall be noted that the number of heat conductive column corresponding to each light emitting unit may be one or more, and may be determined according to the size of the light emitting unit and the circuit layout when setting the heat conductive columns.

In addition, it shall be noted that since the positive electrode and the negative electrode of the light source module 1 are disposed on the layout layer 115 of the metal substrate 1. The current flows from the second copper trace 14 through the second light emitting unit 163, then flows from the second light emitting unit 163 through the upper edge of the second heat conductive column 18 and the upper edge of the first heat conductive column 17 (that is, flowing through the third copper trace 15), and the current finally flows to the first copper trace 13 through the first light emitting unit 161 instead of flowing from the first heat conductive column 17 or the second heat conductive column 18 directly to the metal substrate 11.

In the circuit layout shown in FIG. 4, since the area of the third copper trace 15 is relatively small, the first heat conductive column 17 and the second heat conductive column 18 arranged in the light source module 1 can conduct heat caused by the first light emitting unit 161 and the second heat conducting column 18 more quickly to the metal substrate 11.

Different from the layout shown in FIG. 4, the first light emitting unit 161 and the second light emitting unit 163 in FIG. 5 are disposed in parallel along the first direction D1. Both of the first light emitting unit 161 and the second light emitting unit 163 have the positive electrode E1 and the negative electrode E2 opposite to each other in the second direction D2. The second direction D2 is perpendicular to the first direction D1, and the positive electrode E1 and the negative electrode E2 of the first light emitting unit 161 are respectively adjacent to the negative electrode E2 and the positive electrode E1 of the second direction D2. In other words, in FIG. 5, the first light emitting unit 161 and the second light emitting unit 163 are arranged reversely.

Compared with the layout shown in FIG. 4, the layout shown in FIG. 5 can increase the area of the third copper trace 15, and the first heat conductive column 17 and the second heat conductive column 18 can reduce the heat resistance of the light source module 1. Therefore, the heat generated by the first light emitting unit 161 and the second light emitting unit 163 in FIG. 5 can be conducted to the metal substrate 11 for heat dissipation more quickly than the heat generated by the first light emitting unit 161 and the second light emitting unit 163 in FIG. 4.

According to the above, the light source module of the present invention provides the light source module with heat conductive columns disposed at the light emitting units. By making the heat conductive columns penetrate through the ceramic substrate to contact the metal substrate, the heat conductivity of the light source module can be protruded, and the heat resistance can also be effectively decreased. Therefore, the heat generated by the light emitting unit can be conducted downward more quickly to reduce the serious heat accumulation effect in the hot zone of the light emitting unit and further reduce the light attenuation of the light emitting unit to enhance the service life and optical performance of the light emitting unit.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims

What is claimed is:

1. A light source module, comprising:
   a ceramic substrate;
   a first copper trace being disposed on the ceramic substrate;
   a second copper trace being disposed on the ceramic substrate;
   at least one third copper trace being disposed on the ceramic substrate;
   a first light emitting unit being disposed on the ceramic substrate and having a positive electrode and a negative electrode;
   a second light emitting unit being disposed on the substrate and electrically connected to the first light emitting unit and having a positive electrode and a negative electrode;
   a first heat conductive column being disposed corresponding to the first light emitting unit and penetrating the at least one third copper trace and the ceramic substrate; and
   a second heat conductive column being disposed corresponding to the second light emitting unit and penetrating the at least one third copper trace and the ceramic substrate;
   wherein the negative electrode of the first light emitting unit is connected to the first copper trace, the positive electrode of the second light emitting unit is connected to the second copper trace, and the positive electrode of the first light emitting unit and the negative electrode of the second light emitting unit are connected to the at least one third copper trace, and wherein an end of the first heat conductive column is connected to the positive electrode of the first light emitting unit, and an end of the second heat conductive column is connected to the negative electrode of the second light emitting unit.

2. The light source module as claimed in claim 1, further comprising a metal substrate having a main plate, an insulating layer, and a layout layer, the main plate having a flat part and a protruded part, the insulating layer and the layout layer being disposed on the flat part, and the ceramic substrate being partially disposed on the protruded part.

3. The light source module as claimed in claim 2, wherein another end of the first heat conductive column and another end of the second heat conductive column are connected to the protruded part of the main plate of the metal substrate.

4. The light source module as claimed in claim 3, wherein the first heat conductive column and the second heat conductive column are made of high heat conductivity material.

5. The light source module as claimed in claim 4, wherein the first light emitting unit and the second light emitting unit are disposed in parallel along a first direction, and the positive electrode and the negative electrode of each the first light emitting unit and the second light emitting unit are opposite to each other in the first direction.

6. The light source module as claimed in claim 5, wherein the positive electrode of the first light emitting unit is adjacent to the negative electrode the second light emitting unit.

7. The light source module as claimed in claim 1, wherein the first light emitting unit and the second light emitting unit are disposed in parallel along a first direction, and the positive electrode and the negative electrode of each the first light emitting unit and the second light emitting unit are opposite to each other in a second direction, which is perpendicular to the first direction.

8. The light source module as claimed in claim 7, wherein the positive electrode and the negative electrode of the first light emitting unit are respectively adjacent to the negative electrode and the positive electrode of the second light emitting unit.

* * * * *